United States Patent [19]

Iravani

[11] Patent Number: 6,104,254

[45] Date of Patent: *Aug. 15, 2000

[54] VCO IN CMOS TECHNOLOGY HAVING AN OPERATING FREQUENCY OF 1 GHZ AND GREATER

[75] Inventor: Kamran Iravani, San Jose, Calif.

[73] Assignee: VLSI Technology, Inc., San Jose, Calif.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/972,792

[22] Filed: Nov. 18, 1997

[51] Int. Cl.[7] .............................. H03L 7/099; H03B 5/02
[52] U.S. Cl. .................... 331/57; 331/177 R; 331/175; 331/185; 327/261
[58] Field of Search ...................... 331/57, 175, 177 R, 331/185; 327/157, 261, 280

[56] References Cited

U.S. PATENT DOCUMENTS

| | | | |
|---|---|---|---|
| 5,412,349 | 5/1995 | Young et al. | 331/34 |
| 5,563,553 | 10/1996 | Jackson | 331/57 |
| 5,767,748 | 6/1998 | Nakao | 331/57 |
| 5,963,101 | 10/1999 | Iravani | 331/57 |

*Primary Examiner*—Arnold Kinkead
*Attorney, Agent, or Firm*—Wagner, Murabito & Hao LLP

[57] ABSTRACT

The present invention comprises a CMOS voltage controlled oscillator (VCO) circuit for operation at frequencies of 1 GHz and above. The circuit of the present invention includes a voltage-to-current converter circuit for receiving a VCO input, a replica circuit coupled to the voltage-to-current converter circuit, and a first and second VCO cell coupled to the replica circuit. The first and second VCO cells are also coupled to one another. The circuit of the present invention also includes a VCO output for transmitting a VCO output signal. A first current source is coupled to the first VCO cell to transmit a first current from a power supply to the first VCO cell. A second current source is coupled to the second VCO cell to transmit a second current from the power supply to the second VCO cell. The first VCO cell and the second VCO cell both include respective first and second load transistors coupled to the replica circuit such that the CMOS voltage controlled oscillator circuit of the present invention reliably generates a VCO output signal having a frequency of 1 GHz or above.

29 Claims, 6 Drawing Sheets

500

```
┌─────────────────────────────┐
│ RECEIVE A POWER SUPPLY VOLTAGE │
│                          501 │
└─────────────────────────────┘
              ↓
┌─────────────────────────────┐
│   RECEIVE A CONTROL VOLTAGE  │
│                          502 │
└─────────────────────────────┘
              ↓
┌─────────────────────────────┐
│   GENERATE A CURRENT RESPONSIVE │
│      TO THE CONTROL VOLTAGE  │
│                          503 │
└─────────────────────────────┘
              ↓
┌─────────────────────────────┐
│    MIRROR THE CURRENT IN THE │
│ RESPECTIVE CURRENT SOURCES TO │
│         EACH VCO CELL        │
│                          504 │
└─────────────────────────────┘
              ↓
┌─────────────────────────────┐
│    COUPLE A REPLICA CIRCUIT  │
│   OUTPUT TO EACH OF THE VCO  │
│            CELLS             │
│                          505 │
└─────────────────────────────┘
              ↓
┌─────────────────────────────┐
│  MAINTAIN A STABLE, CLEAN 1GHz │
│   OSCILLATING OUTPUT SIGNAL  │
│                          506 │
└─────────────────────────────┘
```

FIGURE 5

VCO IN CMOS TECHNOLOGY HAVING AN OPERATING FREQUENCY OF 1 GHZ AND GREATER

TECHNICAL FIELD

The present invention relates to the field CMOS technology voltage controlled oscillators. More particularly, the present invention relates to a high speed CMOS voltage controlled oscillator (VCO) for digital communications.

BACKGROUND ART

Voltage controlled oscillators (VCOs) are well known and widely used in the electronics industry. Within the digital communications field, VCOs are used in a variety of applications. Such applications include, for example, frequency synthesizers, signal generation, (e.g., serial transmission clock recovery) and the like. VCOs are typically designed to perform within a given set of boundary conditions and to perform according to a specified standard. Typical conditions include, for example, performance over operating temperature ranges, sensitivity to vibration, output sensitivity to interference, and the like. Typical performance standards include, for example, output signal frequency stability, output signal programmability, and the like.

A typical prior art VCO circuit generates an oscillating output signal having a specified frequency. The signal can have several different wave forms (e.g., square, saw tooth, triangular, etc.). The frequency of the output is tunable and is a function of an input voltage, an external resistance or capacitance, or the like. The type of application in which the VCO circuit is used dictates its operating conditions and performance requirements.

In addition, the type of application also largely determines type of fabrication technology used to manufacture the VCO. A large number of modern digital integrated circuits are fabricated using well known and widely used CMOS technology. Where the VCO circuit is included in a CMOS IC (integrated circuit), it is usually fabricated in CMOS (e.g., fabricated using CMOS process technology).

There is a problem, however, when the application in which the overall IC is used requires the VCO circuit to perform at very high operating frequencies. For example, where the IC is part of a high speed serial transmission system (e.g., gigabit ethernet) it is important that the output frequency of the VCO circuit be stable and be a consistent function of the control inputs (e.g., voltage, capacitance, and the like) while the output frequency is 1 GHz or greater.

In a case where a prior art VCO circuit is used in an application for clock recovery in a gigabit serial transmission system, it is important that the output frequency remain stable and the output waveform remain within specified limits, even at the output frequencies of 1 GHz or more. The output frequency is used to reconstruct a serial transmission clock signal, which in turn, is used to sample data on a serial transmission line. Distortion, defects, irregularity, or variation in the VCO output frequency or the waveform can have a very detrimental effect on the reconstructed clock signal, and hence, could lead to sampling errors, lost data, decreased throughput, or other such problems.

Consequently, for these very high frequency applications it is important that the VCO circuit provide a very stable, "glitch" free output signal at the specified frequency (e.g., 1 GHz). However, prior art CMOS VCOs cannot reliably function at such high frequencies. Prior art CMOS VCOs cannot reliably generate output signals having an acceptable waveform (e.g., free of glitches) and having acceptable stability. Accordingly, system designers are forced to use other, less desirable, alternatives (e.g., transferring data on both the rising and falling edges of a lower speed clock signal, using a separate, non-integrated, non-CMOS VCO, etc.) for high speed applications, such as clock recovery in gigabit serial transmission applications.

Thus, what is required is a CMOS VCO circuit which solves the high speed operation problems of the prior art. What is required is a circuit capable of reliable operation at frequencies of 1 GHz and above. What is required is a circuit which produces a stable output signal having a frequency of 1 GHz or greater and having a waveform free of defects and irregularities. The present invention provides an advantageous solution to the above requirements.

DISCLOSURE OF THE INVENTION

The present invention provides a CMOS VCO circuit which solves the high speed operation problems of the prior art. The VCO circuit of the present invention is capable of reliable operation at frequencies of 1 GHz and above. In addition, the VCO circuit of the present invention generates a stable output signal having a frequency of 1 GHz or greater and having a waveform free of defects and irregularities.

In one embodiment, the present invention comprises a CMOS voltage controlled oscillator (VCO) circuit including a voltage-to-current converter circuit for receiving a VCO input, a replica circuit coupled to the voltage-to-current converter circuit, and a first and second VCO cell coupled to the replica circuit. The first and second VCO cells are also coupled to one another. The circuit of the present invention also includes a VCO output for transmitting a VCO output signal. A first current source is coupled to the first VCO cell to transmit a first current from a power supply to the first VCO cell. A second current source is coupled to the second VCO cell to transmit a second current from the power supply to the second VCO cell. The first VCO cell and the second VCO cell both include respective first and second load transistors coupled to the replica circuit. The first and second VCO cells are optimized for minimum capacitance to facilitate high speed operation. The replica circuit is adapted to provide a replica bias the load transistors within the first and second VCO cells such that the CMOS voltage controlled oscillator circuit of the present invention reliably generates a VCO output signal having a frequency of 1 GHz or above.

In another embodiment, the VCO circuit of the present invention includes a first and second source follower transistor coupled to the first and second VCO cells to function as current sources. The first and second source follower transistors are coupled to directly receive the VCO input. The source follower transistors provide a higher power supply rejection ratio.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 5 shows a flow chart of the steps of a VCO circuit operating process in accordance with one embodiment of the present invention.

BEST MODE FOR CARRYING OUT THE INVENTION

Reference will now be made in detail to the embodiments of the invention, a VCO circuit in CMOS technology having an operating frequency of 1 GHz or greater, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The present invention provides a CMOS VCO circuit which solves the high speed operation problems of the prior art. The VCO circuit of the present invention is capable of reliable operation at frequencies of 1 GHz and above. In addition, the VCO circuit of the present invention generates a stable output signal having a frequency of 1 GHz or greater and having a waveform free of defects or irregularities. The present invention and its benefits are further described below.

Figure 1:
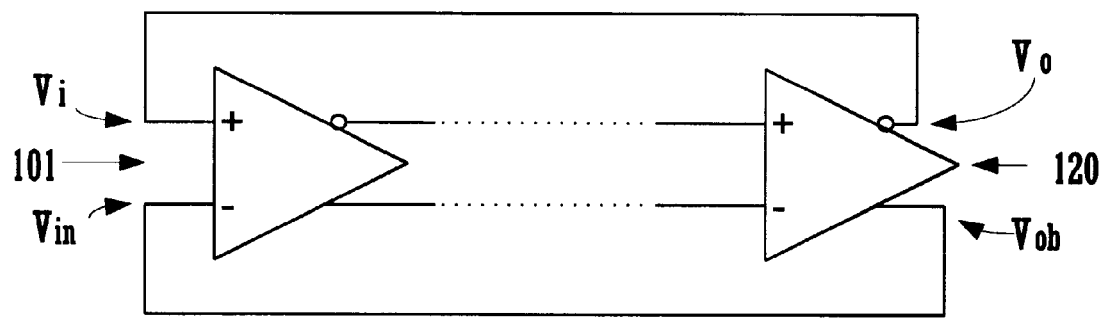
FIG. 1 shows a schematic block diagram of a VCO circuit in accordance with one embodiment of the present invention.

FIG. 1 shows a schematic block diagram of a VCO circuit 100 in accordance with one embodiment of the present invention. VCO circuit 100 illustrates the general scheme of operation of the present invention. VCO circuit 100 is comprised of a plurality of inverters coupled to form a "chain" where the output of the first inverter is coupled to the input of the second inverter, and so on throughout the chain. Each inverter has a positive and a negative input and a corresponding positive and negative output. The first inverter, e.g., inverter 101 of VCO circuit 100 has its outputs coupled to the inputs of the next inverter, and so on, until the last inverter 120 in the chain is coupled. The plurality of inverters between inverter 101 and 120 are represented by dotted lines. The outputs of the last inverter 120 are coupled to the inputs of the first inverter 101.

The resulting feed back effects an oscillation within VCO circuit 100. The number of inverters included in VCO circuit 100 largely determines the resulting natural frequency of oscillation and the total gain. The frequency of oscillation is variable over a range. The degree of variation is determined by the application of a control voltage to the circuitry comprising each inverter. Feedback to the inputs Vi and $Vi_n$ from the outputs Vo and Vob sustain the oscillation. The output signal of VCO circuit 100 is typically taken from the outputs Vo and Vob of the last inverter, inverter 120, although the output signal could be taken from any of the inverters in the chain.

Figure 2:
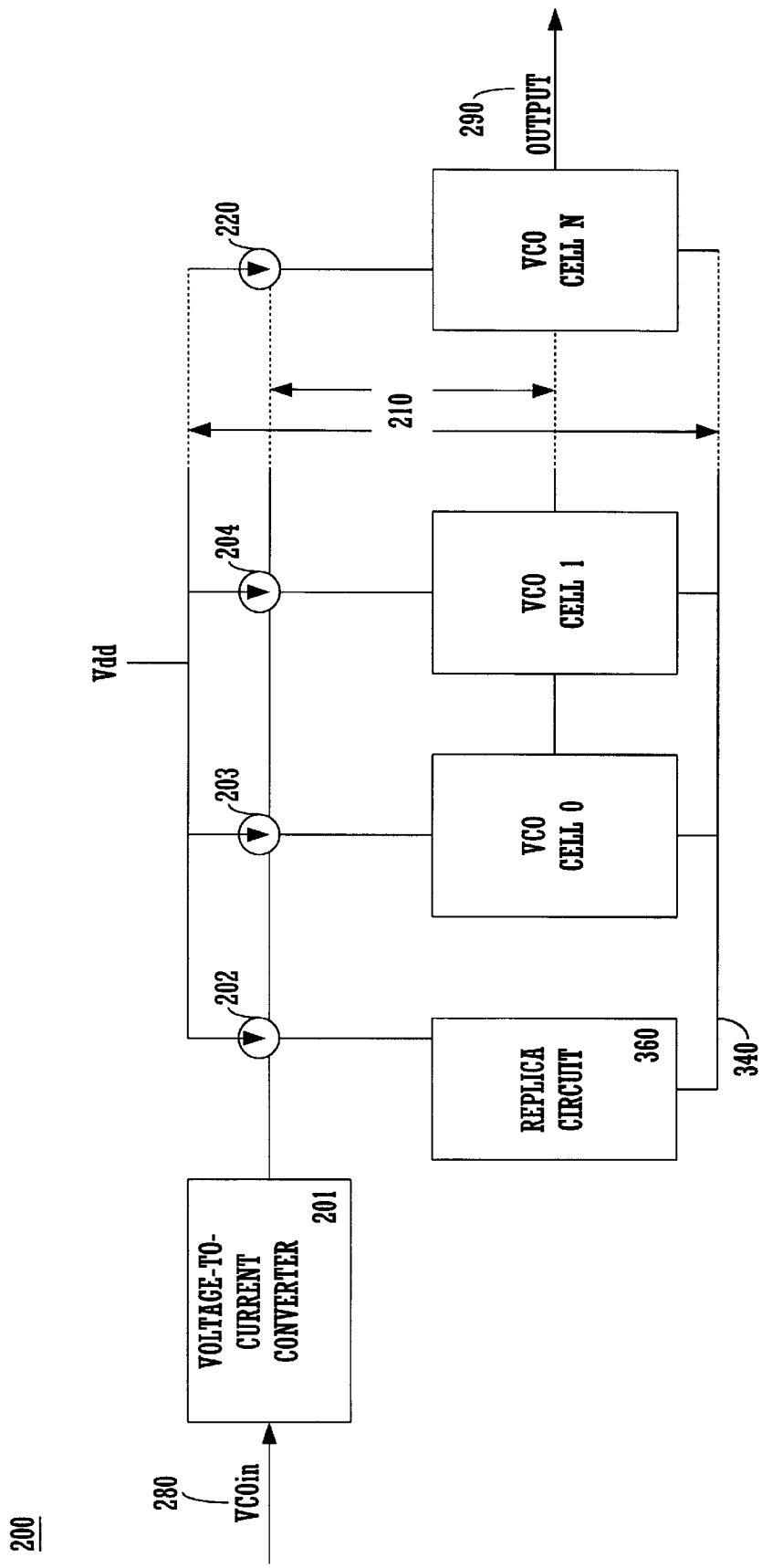
FIG. 2 shows a more detailed block diagram of a VCO circuit in accordance with one embodiment of the present invention.

VCO circuit 100 oscillates and maintains a stable, predictable, output signal at Vo and $Vo_b$ having a frequency which corresponds to an externally applied control voltage (shown in FIG. 2). The frequencies at outputs Vo and $Vo_b$ are substantially the same except for being opposite in phase. The present invention functions by generating a stable output signal having a frequency of 1 GHz or greater and having a waveform free of defects or irregularities.

Referring now to FIG. 2, a more detailed block diagram of a VCO circuit 200 in accordance with present invention is shown. VCO circuit 200 includes a plurality of VCO cells coupled in a chain, in the same manner as inverters 101–120 of VCO circuit 100. The first VCO cell, VCO cell 0, is coupled to VCO cell 1, and so on, through the last VCO cell in the chain, VCO cell n. The plurality of VCO cells (not shown) between VCO cell 1 and VCO cell n are similarly coupled via dotted lines 210. As with the number of inverters in VCO circuit 100, the number of VCO cells in VCO circuit 200 largely determines the resulting natural frequency of oscillation and the total gain. And, similarly to the outputs of VCO circuit 100, the output of VCO circuit 200 taken from the VCO cell coupled furthest from the control voltage input (e.g., VCO cell n). It should be appreciated, however, that the outputs of VCO circuit 200 can be taken from any one of the VCO cells in the chain. Alternatively, several VCO cells, or even all VCO cells, of VCO circuit 200 can be coupled to provide a suitable output, depending upon the particular requirements of an application.

VCO circuit 200, in accordance with the present embodiment, includes a voltage-to-current converter circuit 201. The output of voltage-to-current converter circuit 201 is coupled to each of a plurality of current sources 202, 203, 204, and so on, through to the last current source, current source 220 (e.g., where each of VCO cells 0 through n have a respective corresponding current source). Each of current sources 202–220 are coupled to Vdd (e.g., 3.3 v direct current power supply) and to their respective VCO cells.

The voltage-to-current converter circuit 201 functions by flowing a current responsive to VCOin. As VCOin increases or decreases in magnitude, the current increases and decreases. The current flowing through voltage to current converter 201 is mirrored in each of current sources 202–220.

VCO circuit 200, in accordance with the present embodiment, also includes a replica circuit 360 coupled to current source 202. The replica circuit 360 is designed to match the current and voltage characteristics a typical VCO cell (e.g., VCO cell 0). Replica circuit 360 functions by providing a replica circuit output to each of the VCO cells via line 340 to provide a proper bias voltage.

The frequency of VCO circuit 200 is controlled by varying the amplitude of VCOin. Changes in VCOin cause corresponding changes within voltage-to-current converter circuit 201 and current sources 202–220, which in turn, cause changes in the replica circuit output on line 340, which is coupled to each of the VCO cells. The magnitude of the replica circuit output on line 340, in conjunction with the voltage-to-current converter 201, controls the frequency of oscillation of VCO circuit 200.

Figure 3A:
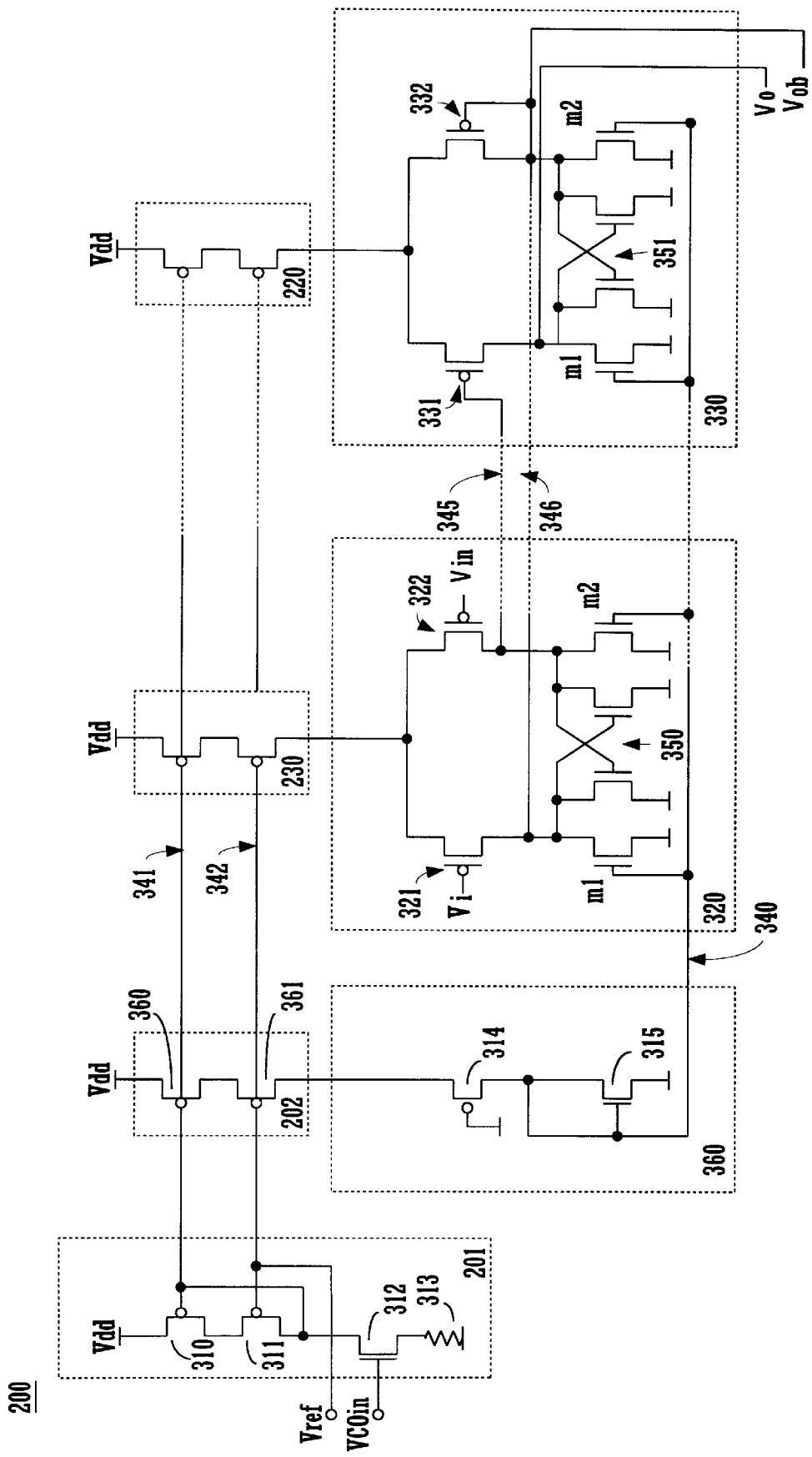
FIG. 3A shows a circuit diagram of the components included in the VCO circuit from FIG. 2.

FIG. 3A shows a circuit diagram of VCO circuit 200. VCO cell 320 corresponds to VCO cell 0 (from FIG. 2) and VCO cell 330 corresponds to VCO cell n. VCO cell 320 includes a transistor 321 and a transistor 322, both coupled to Vdd through current source 203. Input voltages Vi and $Vi_n$ are respectively coupled to transistors 321–322. A load transistor m1 and a load transistor m2 are respectively coupled between transistors 321–322 and line 340. Transistors m1 and m2 are also coupled to cross-connected transistors 350. VCO cell 330 is similarly constructed, including transistors 331 and 332, respective load transistors m1 and m2, and cross-connected transistors 351. VCO cell 330 also includes an output Vo and Vob.

As described above, a plurality of VCO cells (and their corresponding current sources) are coupled between VCO cell 320 and VCO cell 330, along lines 341, 342, 345, 346, and 340. Each of the plurality of VCO cells of FIG. 3A are coupled to lines 341, 342, 345, 346, and 340 in a manner similar to VCO cell 330, as represented by the dashed portions of lines 341, 342, 345, 346, and 340.

Replica circuit 360 includes a transistor 314 and a transistor 315. Transistor 314 is coupled to Vdd via current source 202. The source of transistor 315 is coupled to ground. The source of transistor 314 is coupled to current source 202. Line 340 transmits the replica circuit output to VCO cells 320–330 and is coupled between transistors 314 and 315. This replica circuit output provides a bias voltage to VCO cells 320–330.

Referring still to FIG. 3A, in the present embodiment, each VCO cell, for example, VCO cell 320, functions as a differential inverter having p-channel inputs (e.g., Vi and Vin) and n-channel loads (e.g., m1 and m2). The voltage on line 340 is applied to the gates of the n-channel loads and the cross connected transistors 350 are used to increase gain. The voltage at the node above transistor 321 and 322 is isolated from Vdd by current source 203. Current source 203, as with current sources 202–220, have high impedance to help isolate each VCO cell from noise on Vdd.

In the present embodiment, each of the current sources 202–220 are comprised of a coupled pair of p channel transistors. Current source 202, for example, includes a transistor 360 and a transistor 361. The gates of transistors 360 and 361 are coupled to receive the voltage at the gates of transistors 310 and 311 via lines 341 and 342. Hence, the voltage on lines 341 and 342 keep transistors 360 and 361 in saturation, thus, keeping their impedance high. This helps isolate VCO circuit 200 from noise on Vdd. Current sources 203–220 are similar to current source 202 and function in a similar manner. Current sources such as 203–220 are at times referred to as "cascode transistor" current sources.

The voltage-to-current converter circuit 201 functions by flowing a current responsive to VCOin. This current flows from Vdd to ground through transistors 310–312 and resistor 313. As VCOin increases or decreases in magnitude, the current increases and decreases. Lines 341 and 342 couple voltages from the current-to-voltage converter to each of current sources 202–220. Hence, the current flowing through voltage to current converter 201 is mirrored in each of current sources 202–220.

It should be appreciated that each VCO cell of VCO circuit 200 is optimized for high speed (e.g., high frequency) operation. Each VCO cell, for example, VCO cell 320, is designed to minimize the capacitance between load transistors m1 and m2. For example, VCO cell 320 does not include a clamping transistor between load transistors m1 and m2 to limit the voltage swing, and VCO cell 320 does not couple the gates of load transistors m1 and m2 to their respective drains to limit the voltage swing. In addition, each of the current sources (e.g., current source 203) are designed to flow a larger amount of current to the VCO cells. The gates of the load transistors m1 and m2 are coupled to line 340 such that the output of replica circuit 360 provides bias corresponding to VCOin and Vref (e.g., replica bias). The combination of flowing more current, limiting capacitance, and replica bias allows VCO circuit 200 to oscillate at high frequency, and thus, produce a high frequency VCO output at Vo and Vob. The architecture of VCO circuit 200 is such that the output signal on Vo and Vob is "clean" and free of defects, glitches, and/or anomalies. In addition, it should be appreciated that VCO circuit 200, in accordance with the present invention, provides its advantages while being fabricated with CMOS technology.

Figure 3B:
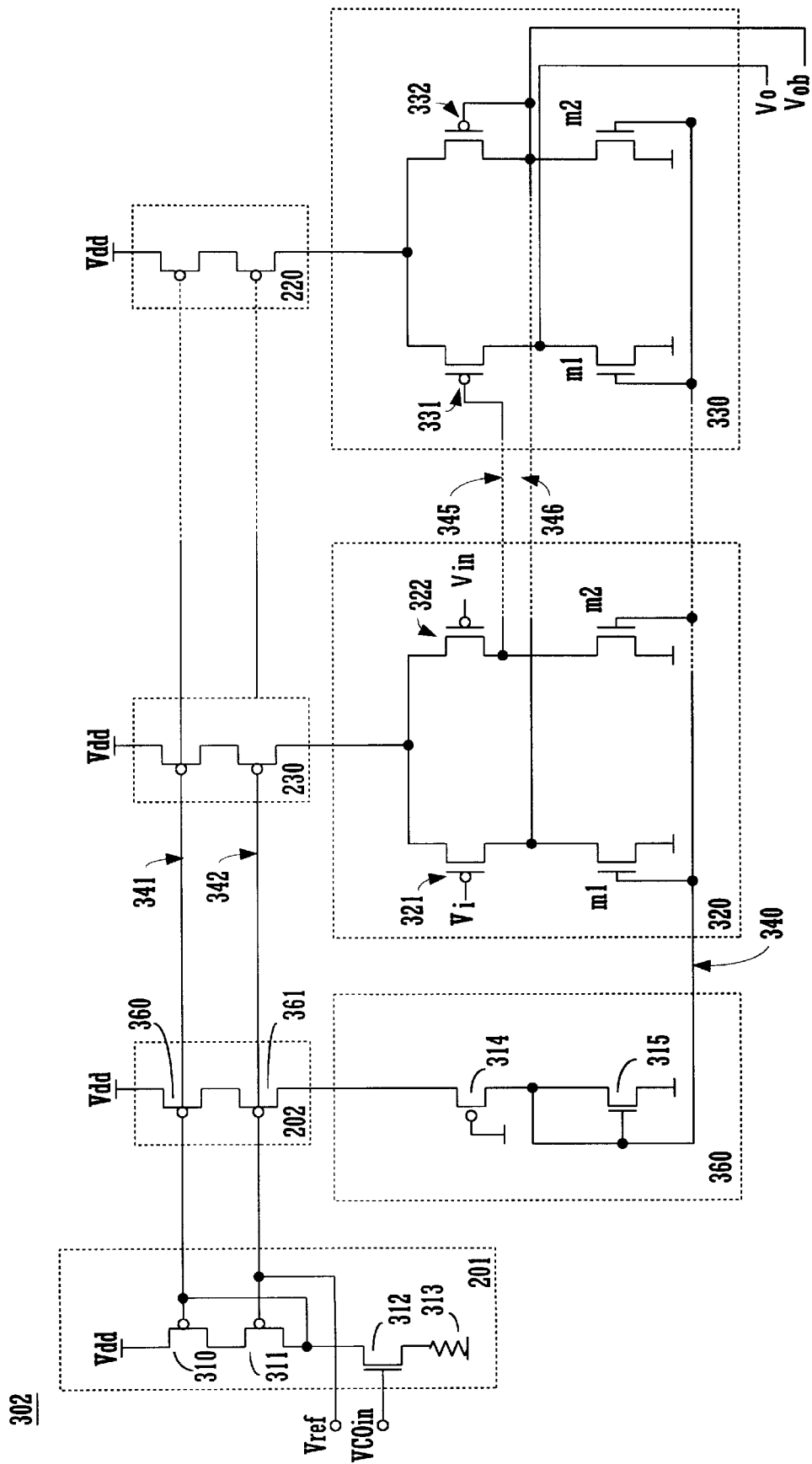
FIG. 3B shows a circuit diagram of the components included in a first alternative embodiment of the VCO circuit from FIG. 2.

FIG. 3B shows a VCO circuit 302 in accordance with an alternate embodiment of the present invention. VCO circuit 302 is similar to VCO circuit 200 except that the cross coupled transistors in each VCO cell (e.g., cross coupled transistors 350 and 351) are eliminated. In other respects, VCO circuit 302 functions similarly to VCO circuit 200. The cross coupled transistors 350 and 351 provide a higher gain on Vo and Vob for VCO circuit 302 in comparison to VCO circuit 200.

Figure 4:
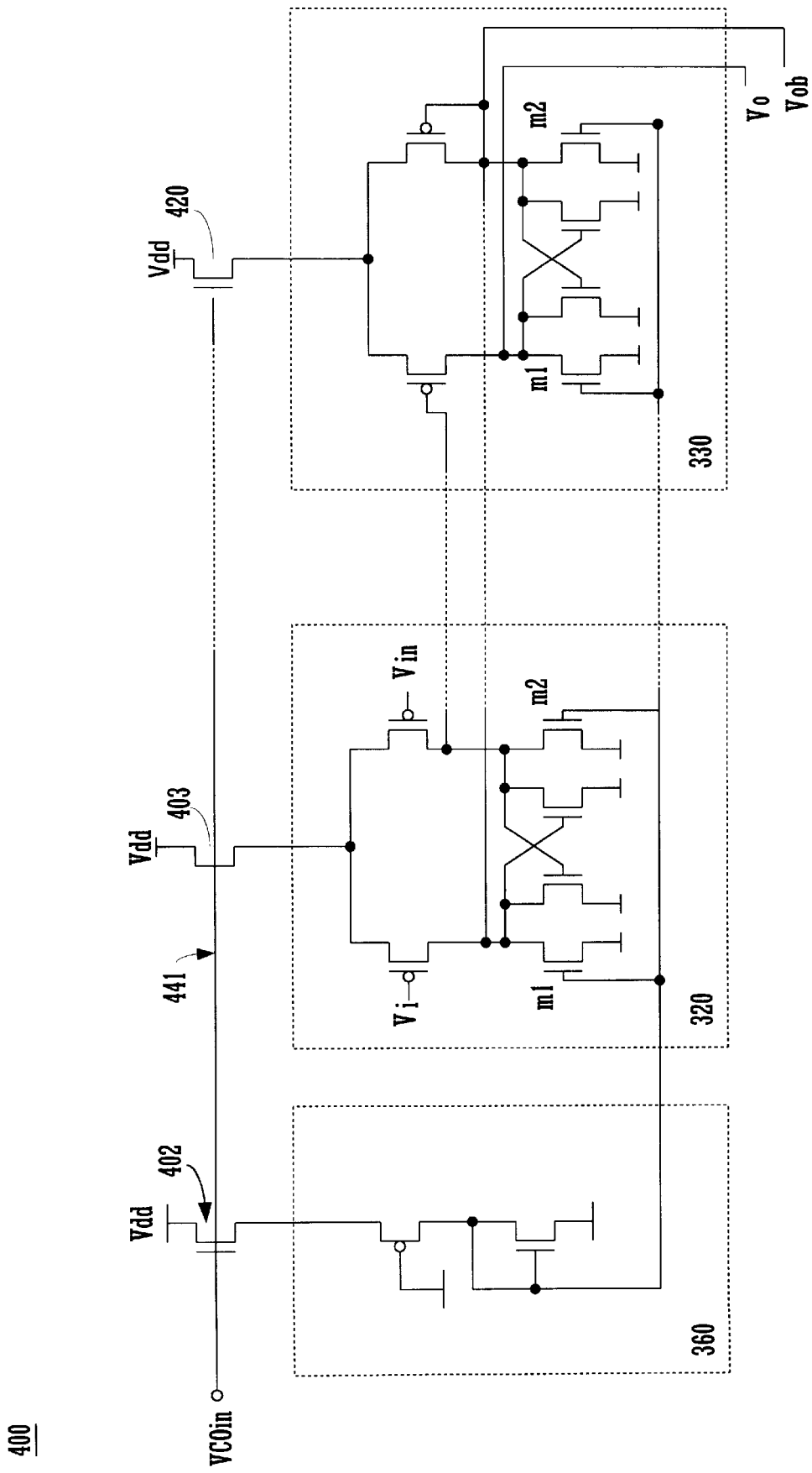
FIG. 4 shows a diagram of a VCO circuit in accordance with a third alternative embodiment of the present invention.

Referring now to FIG. 4, a high power supply rejection ratio VCO circuit 400 in accordance with an alternative embodiment of the present invention is shown. VCO circuit 400 is similar to VCO circuit 300 except that current sources 202–220 are replaced with source follower transistors 402–420, and voltage-to-current converter circuit 201 is eliminated. VCOin is coupled directly to the gates of source follower transistors 402–420 via line 441. The source follower transistors 402–420 function by isolating noise on Vdd from the VCO cells. Source follower transistors 402–420 provide better power supply noise rejection.

FIG. 5 shows a flow chart of the steps of an operating process 500 in accordance with one embodiment of the present invention. Process 500 begins in step 501, where a VCO circuit (e.g., VCO circuit 200 from FIG. 3A) receives a power supply voltage Vdd. VCO circuit 200 is coupled to Vdd via a plurality of included current sources (e.g., current sources 203–220). The current from Vdd sets up an internal oscillation.

In step 502, VCO circuit 200 receives a control voltage input (e.g., VCOin) from an external circuit. The control voltage input adjusts the frequency of oscillation within VCO circuit 200. The frequency of oscillation of VCO circuit 200 is variable in response to changes in the magnitude of the control voltage.

In step 503, a voltage-to-current converter (e.g., voltage-to-current converter circuit 201) generates a current responsive to the control voltage VCOin. This current changes in magnitude as VCOin changes in magnitude.

In step 504, the current generated by the voltage-to-current converter is mirrored in the current sources coupled to each of the VCO cells. The mirrored currents are supplied to each of the VCO cells.

In step 505, the replica circuit output from the replica circuit is coupled to each of the gates of the load transistors of each VCO cell, providing a replica bias to each VCO cell.

In step 506, the VCO circuit in accordance with the present invention maintains a stable oscillating output signal of 1 GHz or greater. The output signal retains is stable and has a waveform free of defects and/or anomalies.

Thus, the CMOS VCO circuit of the present invention solves the high speed operation problems of the prior art. The VCO circuit of the present invention is capable of reliable operation at frequencies of 1 GHz and above. In addition, the VCO circuit of the present invention generates a stable output signal having a frequency of 1 GHz or greater and having a waveform free of defects or irregularities.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A 1 Ghz CMOS voltage controlled oscillator (VCO) circuit, comprising:
    a replica circuit including no more than two transistors to limit capacitance;
    a first VCO cell coupled to said replica circuit;
    a second VCO cell coupled to said first VCO cell and said replica circuits;
    a VCO output for transmitting a VCO output signal;
    a first current source coupled to said first VCO cell to transmit a first current from said power supply to said first VCO cell;
    a second current source coupled to said second VCO cell to transmit a second current from said power supply to said second VCO cell; and
    said first VCO cell and said second VCO cell having respective first and second load transistors coupled to said replica circuit said replica circuit including a single load transistor and implemented to replicate a current and voltage characteristic of said first VCO cell, such that said CMOS voltage controlled oscillator circuit reliably oscillates at a frequency of at least 1 GHz.

2. The oscillator circuit of claim 1, wherein said voltage controlled oscillator circuit is fabricated using CMOS technology.

3. The oscillator circuit of claim 1, further comprising:
    a first and a second voltage input included in each of said first VCO cell and said second VCO cell;
    a first and a second voltage output included in each of said first VCO cell and said second VCO cell;
    said first and second voltage outputs of said first VCO cell respectively coupled to said first and second voltage inputs of said second VCO cell and said first and second voltage outputs of said second VCO cell respectively coupled to said first and second voltage inputs of said first VCO cell to sustain an oscillation within said VCO circuit.

4. The oscillator circuit of claim 1, wherein said first VCO cell and said second VCO cell are optimized for reduced capacitance for higher oscillation frequencies.

5. The oscillator circuit of claim 1, wherein said replica circuit is adapted to provide a bias to said first and second load transistors of said first VCO cell and said second VCO cell for higher oscillation frequencies and to dynamically adjust Vgs and Vds of said first VCO cell and said second VCO cell to maintain stable oscillation at a frequency of at least 1 Ghz.

6. The oscillator circuit of claim 1, wherein said first and second current sources each further comprise a plurality of cascode transistors.

7. The oscillator circuit of claim 1, wherein said VCO output is coupled to said first or said second VCO cell to transmit a VCO output signal.

8. The oscillator circuit of claim 1, wherein said replica bias and a reduced capacitance of said first VCO cell and said second VCO cell facilitate said VCO output signal having a frequency of 1 GHz or above and has a waveform free of distortion and defects.

9. The oscillator circuit of claim 1, further comprising a voltage-to-current converter circuit for receiving a VCO input, said voltage-to-current converter circuit coupled to said replica circuit and to said first and second current sources.

10. The oscillator circuit of claim 1, wherein said first and second current sources comprise respective source follower transistors to provide a higher power supply rejection ratio, said source follower transistors coupled to directly receive a VCO input.

11. A CMOS voltage controlled oscillator (VCO) circuit for generating a clean, defect free, VCO output signal having a frequency of 1 GHz or greater, comprising:
    a voltage-to-current converter circuit for receiving a VCO input;
    a replica circuit coupled to said voltage-to-current converter circuit, said replica circuit including no more than two transistors to limit capacitance;
    a first VCO cell coupled to said replica circuit;
    a second VCO cell coupled to said first VCO cell and said replica circuit;
    a VCO output for transmitting a VCO output signal;
    a first current source coupled to said first VCO cell to transmit a first current from a power supply to said first VCO cell;
    a second current source coupled to said second VCO cell to transmit a second current from said power supply to said second VCO cell; and
    said first VCO cell and said second VCO cell having respective first and second load transistors coupled to said replica circuit, wherein said replica circuit is adapted to provide a replica bias to said first and second load transistors, and said replica circuit including a single load transistor and implemented to replicate a current and voltage characteristic of said first VCO cell such that said VCO output signal has a frequency of 1 GHz or above having a waveform free of defects and irregularities, and such that said VCO output remains within nominal limits across a process variation range.

12. The oscillator circuit of claim 11, wherein said voltage controlled oscillator circuit is fabricated using CMOS technology.

13. The oscillator circuit of claim 11, further comprising:
    first and second voltage inputs included in each of said first VCO cell and said second VCO cell;
    first and second voltage outputs included in each of said first VCO cell and said second VCO cell;
    said first and second voltage outputs of said first VCO cell respectively coupled to said first and second voltage inputs of said second VCO cell and said first and second voltage outputs of said second VCO cell respectively coupled to said first and second voltage inputs of said first VCO cell to sustain an oscillation within said VCO circuit.

14. The oscillator circuit of claim 11, wherein said first VCO cell and said second VCO cell are optimized for reduced capacitance for higher oscillation frequencies.

15. The oscillator circuit of claim 11, wherein said first and second current sources each further comprise a plurality of cascode transistors.

16. The oscillator circuit of claim 11, wherein said first and second current sources further comprise respective source follower transistors.

17. The oscillator circuit of claim 11, wherein said VCO output is coupled to said first or said second VCO cell to transmit said VCO output signal.

18. In a CMOS voltage controlled oscillator (VCO) circuit including a replica circuit coupled to a plurality of VCO cells, a method of generating a stable, clean, VCO output signal having a frequency of 1 GHz or above and having a waveform free of detects and irregularities, the method comprising the steps of:
   a) receiving a power supply voltage in a VCO circuit from a coupled power supply;
   b) receiving a control voltage input in said VCO circuit;
   c) supplying said control voltage input to a plurality of current sources coupled to a respective plurality of VCO cells in said VCO circuit;
   d) using a replica circuit to generate a replica circuit output, said replica circuit including no more then two transistors to limit capacitance;
   e) supplying said replica circuit output to each of said VCO cells to provide a replica bias;
   f) generating an oscillating VCO output signal responsive to said control voltage input, said replica circuit including a single load transistor and implemented to replicate a current and voltage characteristic of said first VCO cell such that said VCO output signal has a frequency of 1 GHz or greater and having a waveform free of defects and irregularities.

19. The method of claim 18, further including the step of generating a first current responsive to said control voltage input by using a voltage-to-current converter and mirroring said first current in each of said current sources.

20. The method of claim 19, further including the step of mirroring said first current in each of said current sources wherein each of said current sources are comprised of respective source follower transistors.

21. A CMOS voltage controlled oscillator (VCO) circuit fabricated using CMOS technology operable for generating a clean, defect free, VCO output signal having a frequency of 1 GHz or greater, comprising:
   a voltage-to-current converter circuit for receiving a VCO input;
   a replica circuit coupled to said voltage-to-current converter circuit, said replica circuit including no more than two transistors to limit capacitance;
   a first VCO cell coupled to said replica circuit;
   a second VCO cell coupled to said first VCO cell and said replica circuit;
   a VCO output for transmitting a VCO output signal;
   a first current source coupled to said first VCO cell to transmit a first current from a power supply to said first VCO cell;
   a second current source coupled to said second VCO cell to transmit a second current from said power supply to said second VCO cell, wherein said first current source and said second current source each further comprise a plurality of cascode transistors; and
   said first VCO cell and said second VCO cell optimized for reduced capacitance for higher oscillation frequencies, said first VCO cell and said second VCO cell having respective first and second load transistors coupled to said replica circuit, wherein said replica circuit is adapted to provide a replica bias to said first and second load transistors, and wherein said replica circuit includes a single load transistor and is implemented to replicate a current and voltage characteristic of said first VCO cell, such that said VCO output signal has a frequency of 1 GHz or above having a waveform free of defects and irregularities, and such that said VCO output remains within nominal limits across a process variation range.

22. The oscillator circuit of claim 21, wherein said voltage to current converter includes a first p channel transistor and a second p channel transistor coupled to said first current source and said second current source such that a current flowing through said first p channel transistor and said second p channel transistor is mirrored within said first current source and said second current source.

23. The oscillator circuit of claim 22, wherein said first p channel transistor and said second p channel transistor are coupled to ground via and n channel transistor, the gate of said n channel transistor coupled to receive a VCO input.

24. The oscillator circuit of claim 23, wherein a reference voltage is coupled to a gate of said second p channel transistor, the gate of said first p channel transistor coupled to a node between said second p channel transistor and said n channel transistor.

25. The oscillator circuit of claim 21, wherein said first VCO cell and said second VCO cell include respective first and second cross coupled transistors operable for increasing a gain of said first and second VCO cells.

26. The oscillator circuit of claim 21, wherein said voltage to current converter includes no more than three transistors to limit capacitance of said oscillator circuit.

27. The oscillator circuit of claim 21, wherein said single load transistor included in said replica circuit is coupled to receive a current from a third current source, said third current source coupled to said voltage to current converter.

28. The oscillator circuit of claim 27, wherein said replica circuit receives a mirror current from said third current source, and wherein said first current received by said first VCO cell and said second current received by said second VCO cell are substantially the same as said mirror current.

29. The oscillator circuit of claim 27, wherein said replica circuit includes no more than two transistors to limit capacitance of said oscillator circuit.

* * * * *